(12) United States Patent
Fager et al.

(10) Patent No.: US 11,909,129 B2
(45) Date of Patent: Feb. 20, 2024

(54) INTEGRATED ACTIVE DOHERTY ANTENNA TRANSMITTER

(71) Applicant: Telefonaktiebolaget LM Ericsson (publ), Stockholm (SE)

(72) Inventors: Christian Fager, Mölnlycke (SE); William Hallberg, Gothenburg (SE); Oleg Iupikov, Gothenburg (SE); Marianna Ivashina, Gothenburg (SE); Rob Maaskant, Gothenburg (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 753 days.

(21) Appl. No.: 16/976,385

(22) PCT Filed: May 31, 2018

(86) PCT No.: PCT/EP2018/064387
§ 371 (c)(1),
(2) Date: Aug. 27, 2020

(87) PCT Pub. No.: WO2019/166110
PCT Pub. Date: Sep. 6, 2019

(65) Prior Publication Data
US 2021/0296776 A1 Sep. 23, 2021

Related U.S. Application Data

(60) Provisional application No. 62/636,233, filed on Feb. 28, 2018.

(51) Int. Cl.
*H03F 1/02* (2006.01)
*H01Q 9/04* (2006.01)
(Continued)

(52) U.S. Cl.
CPC .......... *H01Q 9/0414* (2013.01); *H01Q 5/392* (2015.01); *H01Q 9/045* (2013.01); *H03F 1/0288* (2013.01); *H03F 3/195* (2013.01); *H03F 3/245* (2013.01)

(58) Field of Classification Search
CPC ...... H01Q 9/0414; H01Q 5/392; H01Q 9/045; H03F 1/0288; H03F 3/195; H03F 3/245
See application file for complete search history.

(56) References Cited

U.S. PATENT DOCUMENTS 9,614,479 B2    4/2017 Hallberg et al.
2007/0008221 A1*   1/2007 Tseng .................. H01Q 9/42
                                                343/702
(Continued)

FOREIGN PATENT DOCUMENTS

CN     102355198 A    2/2012
GB       2475501 A    5/2011
(Continued)

OTHER PUBLICATIONS

International Search Report and Written Opinion of the International Searching Authority, PCT/EP2018/064387, dated Jul. 11, 2018, 9 pages.
(Continued)

*Primary Examiner* — David E Lotter
(74) *Attorney, Agent, or Firm* — Sage Patent Group

(57) ABSTRACT

System including a dual-fed antenna element is designed to present 2×2 port impedances that guarantee high efficiency operation of the main- and auxiliary transistors at peak- and backed off power. The proposed solution eliminates the need for lossy power combining, such as PCB based circuit combining or impedance matching networks between the antenna element and the main- and auxiliary amplifiers. The
(Continued)

power from the main- and auxiliary transistors are combined at the circuit level by the antenna element.

9 Claims, 4 Drawing Sheets

(51) Int. Cl.
*H01Q 5/392* (2015.01)
*H03F 3/195* (2006.01)
*H03F 3/24* (2006.01)

(56) References Cited

U.S. PATENT DOCUMENTS

| | | |
|---|---|---|
| 2014/0002182 A1 | 1/2014 | Xu et al. |
| 2016/0276985 A1* | 9/2016 | Fager .................. H03F 3/211 |
| 2019/0081385 A1* | 3/2019 | Avser .................. H01Q 5/328 |
| 2019/0238165 A1* | 8/2019 | Granstam ............... H04B 1/44 |

FOREIGN PATENT DOCUMENTS

| | | |
|---|---|---|
| WO | 2011127868 A2 | 10/2011 |
| WO | WO 2015/055242 A1 | 4/2015 |
| WO | WO 2017/220131 A1 | 12/2017 |

OTHER PUBLICATIONS

Jia, S., et al., "A Novel Doherty Transmitter Based on Antenna Active Load Modulation," IEEE Microwave and Wireless Components Letters vol. 25, No. 4, Apr. 2015, (XP011577895) 3 pages.

F. H. F. H. Raab et al., "Power amplifiers and transmitters for RF and microwave," IEEE Trans. Microw. Theory Tech., vol. 50, No. 3, pp. 814-826, Mar. 2002.

V. Camarchia, M. Pirola, R. Quaglia, S. Jee, Y. Cho, and B. Kim, "The Doherty Power Amplifier: Review of Recent Solutions and Trends," IEEE Trans. Microw. Theory Tech., vol. 63, No. 2, pp. 559-571, Feb. 2015.

M. Ozen, N. Rostomyan, K. Aufinger, and C. Fager, "Efficient Millimeter Wave Doherty PA Design Based on a Low-Loss Combiner Synthesis Technique," IEEE Microw. Wirel. Components Lett., vol. 27, No. 12, pp. 1143-1145, Dec. 2017.

M. Ozen, K. Andersson, and C. Fager, "Symmetrical Doherty Power Amplifier With Extended Efficiency Range," IEEE Trans. Microw. Theory Tech., vol. 64, No. 4, pp. 1273-1284, Apr. 2016.

W. Hallberg, M. Ozen, D. Gustafsson, K. Buisman, and C. Fager, "A Doherty Power Amplifier Design Method for Improved Efficiency and Linearity," IEEE Trans. Microw. Theory Tech., vol. 64, No. 12, pp. 4491-4504, Dec. 2016.

W. R. Deal, V. Radisic, Yongxi Qian, and T. Itoh, "Integrated-antenna push-pull power amplifiers," IEEE Trans. Microw. Theory Tech., vol. 47, No. 8, pp. 1418-1425, 1999.

V. Radisic, Y. Qian, and T. Itoh, "Novel architectures for high-efficiency amplifiers for wireless applications," IEEE Trans. Microw. Theory Tech., vol. 46, No. 11 Part 2, pp. 1901-1909, 1998.

W.C. Liao et al., "A Ka-Band Active Integrated Antenna for 5G Applications: Initial Design Flow," in 2nd URSI AT-RASC, 2018, 4 pages.

H. Wang et al., "Towards Energy-Efficient 5G Mm-Wave links: Exploiting broadband Mm-Wave doherty power amplifier and multi-feed antenna with direct on-antenna power combining," in 2017 IEEE Bipolar/BiCMOS Circuits and Technology Meeting (BCTM), 2017, pp. 30-37.

P.-S. Kildal, Foundations of Antenna Engineering: A Unified Approach for Line-Of-Sight and Multipath. Artech House Publishers, 2015, 450 pages.

M. Pampin-Gonzalez, M. Ozen, C. Sanchez-Perez, J. Chani-Cahuana, and C. Fager, "Outphasing combiner synthesis from transistor load pull data," in 2015 IEEE MTT-S International Microwave Symposium, 2015, pp. 1-4.

Chinese Office Action, Chinese Patent Application No. 201880090403. 6, dated Aug. 11, 2023, 9 pages.

* cited by examiner

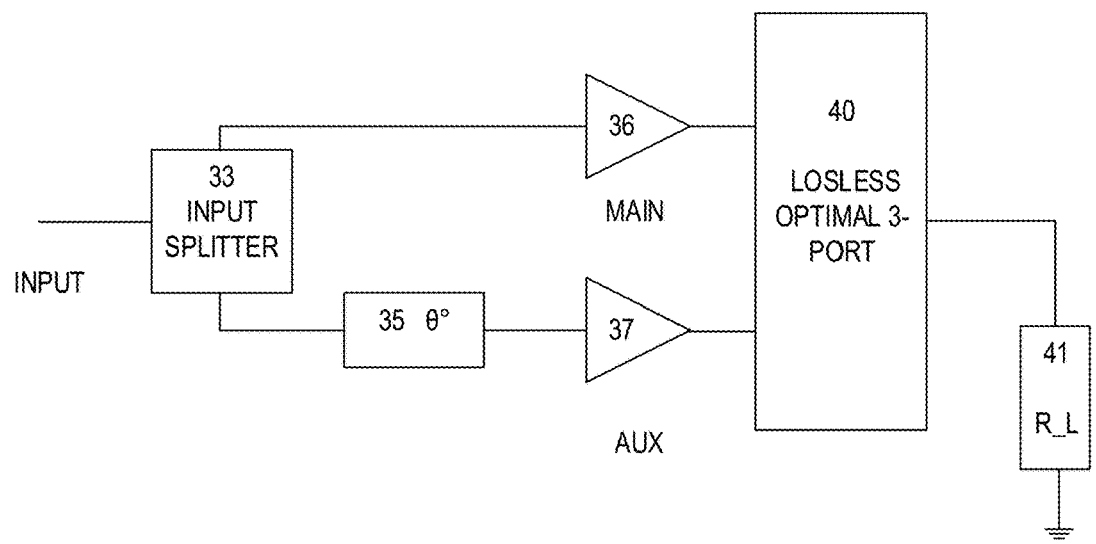
FIG. 1 – PRIOR ART
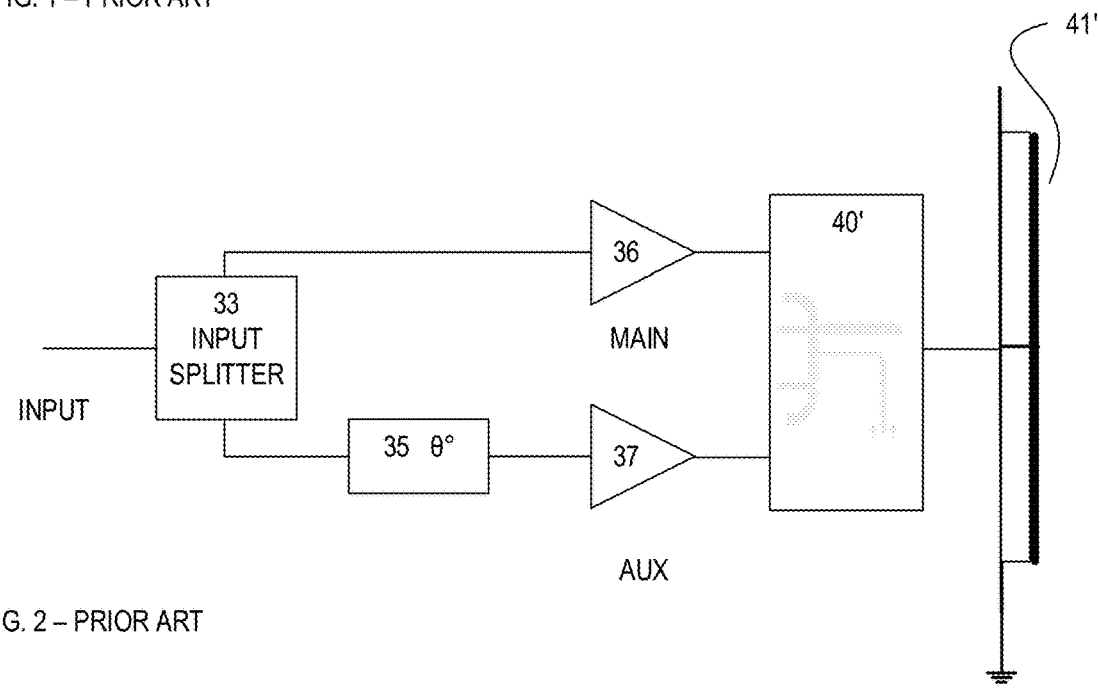
FIG. 2 – PRIOR ART
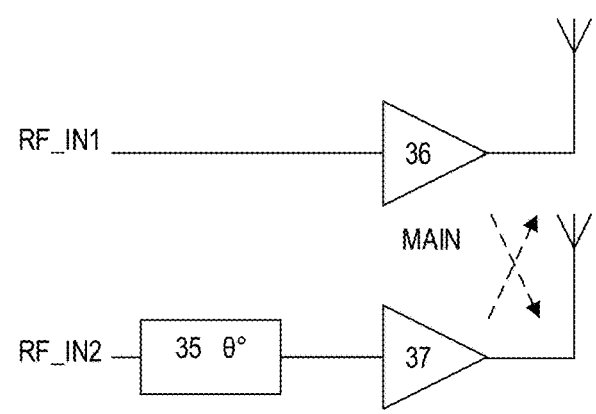
FIG. 3 – PRIOR ART ated antenna transmitters. Considering the Rayleigh-like amplitude distribution of spectrally efficient communication signals, the efficiency at backed-off power levels is of highest importance [1, see references below]. The Doherty Power Amplifier, PA, architecture, which is based on mutual active load modulation between a main- and an auxiliary PA through a tailored combiner network, has emerged as one of the most competitive solutions [2]. The Doherty PA performance is severely constrained by transistor parasitics, and losses associated with its practical realization. Recently, a black-box combiner method was proposed where the conventional combiner topology is replaced by an analytically derived network that is synthesized to simultaneously absorb parasitic effects, perform the impedance matching, and satisfy the desired mutual load modulation between the main- and auxiliary transistor branches [3][4]. It has been shown that this approach leads to lower power losses in the combiner [5], higher efficiency [6], and potentially improved linearity [7] relative to conventional design methods.

INTEGRATED ACTIVE DOHERTY ANTENNA TRANSMITTER

CROSS REFERENCE TO RELATED APPLICATIONS

This application is a 35 U.S.C. § 371 national stage application of PCT International Application No. PCT/EP2018/064387 filed on May 31, 2018, which in turns claims domestic priority to U.S. Provisional Patent Application No. 62/636,233, filed on Feb. 28, 2018, the disclosures and content of which are incorporated by reference herein in their entirety.

TECHNICAL FIELD

The present invention is directed to methods and apparatuses involving active antenna arrays, power amplifiers, and antennas.

BACKGROUND

Modern wireless communication systems rely on active antenna technologies for increased capacity, higher flexibility, and improved energy efficiency. The wavelength dictates the footprint available by each active antenna element. Together with the need for reduced production cost and small form factor, this drives the development of highly integrated radio solutions.

An important research area has been to improve the efficiency of power amplifiers to minimize heat dissipation problems in active antenna transmitters. Considering the Rayleigh-like amplitude distribution of spectrally efficient communication signals, the efficiency at backed-off power levels is of highest importance [1, see references below]. The Doherty Power Amplifier, PA, architecture, which is based on mutual active load modulation between a main- and an auxiliary PA through a tailored combiner network, has emerged as one of the most competitive solutions [2]. The Doherty PA performance is severely constrained by transistor parasitics, and losses associated with its practical realization. Recently, a black-box combiner method was proposed where the conventional combiner topology is replaced by an analytically derived network that is synthesized to simultaneously absorb parasitic effects, perform the impedance matching, and satisfy the desired mutual load modulation between the main- and auxiliary transistor branches [3][4]. It has been shown that this approach leads to lower power losses in the combiner [5], higher efficiency [6], and potentially improved linearity [7] relative to conventional design methods.

Antenna radiating elements are traditionally designed independently from the power amplifiers, assuming a standard 50-ohm interface impedance. Co-design of PAs and antenna elements have mainly focused on improved efficiency at peak power by optimizing the antenna to present the desired fundamental- and harmonic impedances to the active transistor [8][9]. Recently, it has been shown that this co-design requires a trade-off between the antenna radiation efficiency (and radiation resistance) on the one hand, which are affected by antenna dimensions, and on the other hand the optimal PA load resistance [10].

In active antenna arrays, the fields from multiple antenna elements are spatially superposed. Higher effective radiated power (EIRP) can therefore be achieved with relatively lower output power per antenna if the number of antennas increase, but to the price of a narrow total beam of the array antenna [11].

Recently, an antenna-integrated PA was proposed [12] where the active load modulation between the main- and auxiliary amplifiers was implemented through the mutual coupling between two spatially separated patch antenna elements which were printed on the same extended Printed Circuit Board, PCB, structure as the PA. The configuration of such a transmitter is shown in FIG. 3 below. The resulting two-element patch antenna array was therefore simultaneously acting as a radiating element and a Doherty combiner. This transmitter is however not suitable for MIMO (Multiple Input Multiple Output) array transmitters. This is mainly due to the following reasons: (i) Since the main- and auxiliary-transistor have a non-equal drive level versus power in a Doherty PA, with spatially separated antenna elements, this will cause a severe beam deformation or gain variation in a certain direction as a function of input power. This type of nonlinear pattern distortion is known to severely degrade the performance of wireless communication systems; (ii) Since a patch antenna size is about $0.5\lambda \times 0.5\lambda$ (where $\lambda$ is the wavelength), the fusion of two spatially separated patches into one radiating element creates the inter-element-separation distance in arrays of such double-patch elements that is $\geq \lambda$. This is at least a factor 2 too large to satisfy the necessary condition for non-radiating grating lobes in beam-steering (regular) arrays of such double-patch elements.

SUMMARY

For typical prior art transmitter designs, PAs and antennas are designed independently, assuming a 50-ohm interface impedance. Intermediate matching and Doherty combiner networks are therefore used. This causes excessive power losses, higher cost, and large size—contrary to what is needed in emerging active antenna arrays.

It is not desirable to only rely on spatial power combining to reach the desired Equivalent Isotopically Radiated Power, EIRP, level. The beam becomes very narrow, which makes the systems more sensitive. More antennas also occupy a larger area.

In the solution proposed by Jia et al. [12], two antenna elements are employed, each fed from the main- and auxiliary amplifiers, respectively. The main- and auxiliary-transistor have a non-equal drive level versus power in a Doherty PA. With spatially separated antenna elements, this will cause a severe beam deformation or gain variation in a certain direction as a function of input power. This type of nonlinear pattern distortion is severely degrading the performance of wireless communication systems. Finally, this solution results in the two-antenna element size that is too large (in practice, at least a factor of 2 too large) to satisfy the requirement for no radiating grating lobes in beam-steering (regular) arrays of such elements [13]. Hence, this element is not suited for scanning array antenna applications. It is a first object to set forth a methods and apparatuses for providing improved and more reliable performance.

It is an object of the invention to set forth active antenna transmitters for emerging wireless communication systems that need to be energy efficient, low cost, and of small size.

This object has been achieved by a transmitter comprising a Doherty amplifier and an antenna element, the Doherty amplifier comprising an input splitter, for splitting an input signal to a main amplifier having an output and to a phase delay connecting again to an auxiliary amplifier having an output. The antenna element is a dual-fed antenna element having first and second antenna parts, wherein the first antenna part has a first feed, and the second antenna part has a second feed. The output of the main amplifier is connecting to the first feed of the dual feed antenna element. The output of the auxiliary amplifier is connecting to the second feed of the dual feed antenna element. Moreover, the dual-fed antenna element implements lossy two-port parameters of a combiner derivation such that the antenna element simultaneously is acting as a radiator, impedance matching network, and Doherty combiner.

The above object has moreover been achieved by method of constructing a transmitter comprising a Doherty amplifier and an antenna element, comprising the steps of providing the Doherty amplifier comprising an input splitter, for splitting an input signal to a main amplifier having an output and to a phase delay connecting again to an auxiliary amplifier having an output;

providing an antenna element that is a dual-fed antenna element having first and second antenna parts, the first antenna part having a first feed, the second antenna part having a second feed;

arranging the output of the main amplifier connecting to the first feed of the dual feed antenna element;

arranging the output of the auxiliary amplifier connecting to the second feed of the dual feed antenna element;

forming the dual-fed antenna element such that it implements lossy two-port parameters of a combiner derivation such that the antenna element simultaneously is acting as a radiator, impedance matching network, and Doherty combiner.

Among the advantages are:

Eliminate intermediate matching networks between PA and antenna in order to reduce size, cost and power losses Use the Doherty PA architecture to improve the efficiency at backed off power levels, Employ power combining inside the non-radiating low-loss parts of the antenna to increase the power radiated per element To render the directivity pattern of a single element virtually independent on the input power to the Doherty PA To avoid implementations having a set of spatially distributed antennas acting as a single radiating element To provide one antenna element with two feeds in order to reduce the inter-element separation distance in arrays of such elements by at least a factor of 2.

Based on these objectives, an embodiment of the invention uses a dual-fed antenna element to simultaneously act as a Doherty PA combiner network, a field radiating element, and a circuit level power combining device, as a building block of active antenna array transmitters or a single-antenna transmitter.

An embodiment of a dual-fed antenna element is provided that is provided to present 2×2 port impedances that guarantee high efficiency operation of the main- and auxiliary transistors at peak- and backed off power. The embodiment eliminates the need for lossy power combining (such as PCB based circuit combining) or impedance matching networks between the antenna element and the main- and auxiliary amplifiers. The power from the main- and auxiliary transistors are combined at the circuit level by the antenna element.

BRIEF DESCRIPTION OF THE DRAWINGS

FIG. 1 shows transmitter comprising a Doherty PA design using the known black-box combiner method in [6], [7] where the combiner is a synthesized lossless three-port combiner with a resistive load termination, FIG. 2 shows a realization of the FIG. 1 transmitter, FIG. 3 shows a further prior art transmitter.

DETAILED DESCRIPTION

Figure 4:
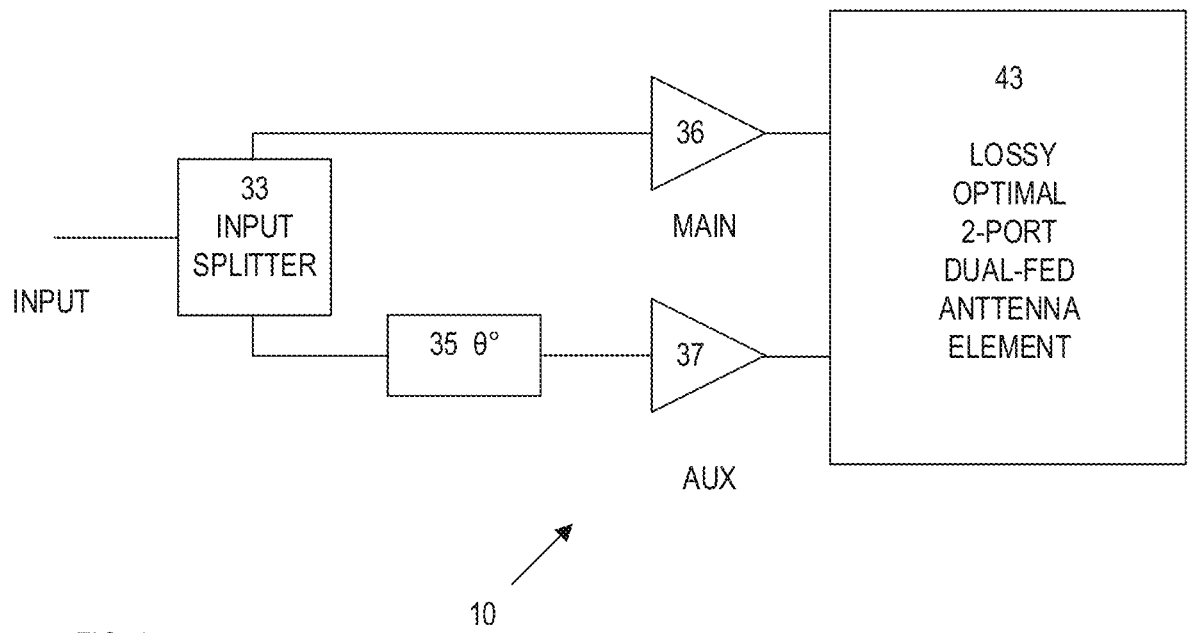
FIG. 4 shows an embodiment a transmitter according to the invention where a dual-fed antenna element implements the black-box Doherty combiner network.

FIG. 1 shows a prior art implementation comprising input splitter 33, phase delay 35, main transistor amplifier 36, auxiliary transistor amplifier 37, lossless optimal 3-port 40 and a load resistor, R_L, 41.

FIG. 2 is a realization of the FIG. 1 optimized design in which the lossless optimal 3 port 40 and the load resistor 41 is implemented as combiner network 40' and a single fed planar patch antenna element 41'.

An embodiment of the invention utilizes the black-box Doherty combiner design approach known for designing a transmitter and a dual-fed antenna element.

The black-box Doherty design method is presented in [6], [7]. Using this method, a combiner two-port impedance matrix is derived analytically from main- and auxiliary transistor 36, 37 load-pull data at peak- and backed off power levels and an unknown phase delay 35 of the auxiliary transistor input signal. A lossy two-port network 43 can be decomposed into a lossless three-port Doherty combiner network 40, and an external resistive termination 41. The unknown phase delay 35 is determined by the constraints of this decomposition. In a conventional implementation, the antenna element 41' would replace the resistive load 41.

By design, the two- and three-port combiner networks 40, 43 implement impedance matching and active load modulation to satisfy conditions for high power and high efficiency.

An embodiment of the invention is shown in FIG. 4 and comprises input splitter 33, phase delay component 35, main amplifier 36, auxiliary amplifier 37 and lossy optimal 2-port dual-fed antenna element (inside) 43.

Figure 5:
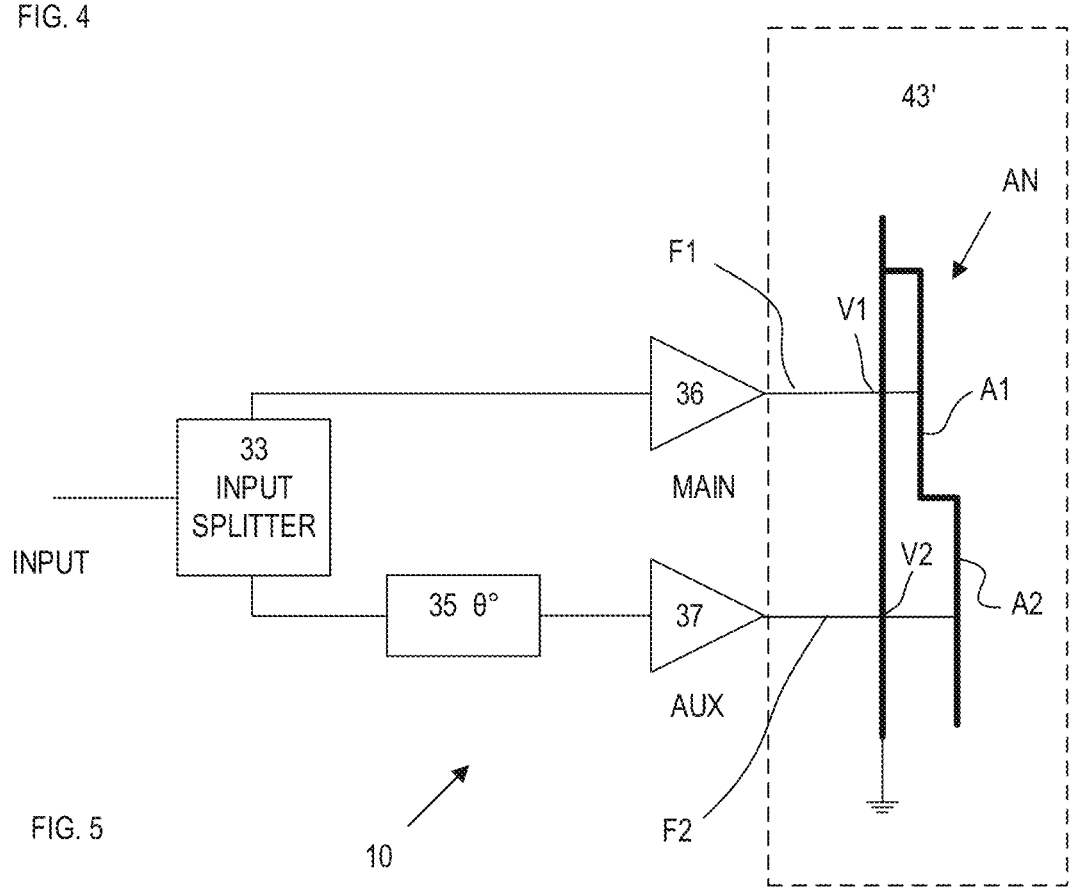
FIG. 5 shows further implementing details of the FIG. 4 transmitter.

In FIG. 5, an embodiment of the invention is shown wherein the FIG. 4 transmitter design is realized as a dual fed antenna element implementation 43' comprising dual fed antenna element AN, and feed network F1, F2, e.g. implemented on a PCB on which the transistors are mounted. The respective feeds F1, F2 may again connect to respective vias V1, V2 connecting to antenna element parts A1, A2 of the dual fed antenna element AN. In this embodiment, the output of the transistor of the main amplifier 36 is connected to feed line F1 and the output of the transistor of the auxiliary amplifier 37 is connected to feed line F2.

According to an aspect of an embodiment of the invention the lossless three-port combiner network 40 with external load 41 in FIG. 1 is replaced with a dual-fed antenna element 43'. The dual-fed antenna element will thus implement the lossy two-port parameters 43 used in a black-box combiner derivation. The loss inside the two-port 43 corresponds to the radiation- and resistive losses of the antenna element 43'. The resulting antenna element 43' will therefore simultaneously act as a radiator, impedance matching network, and Doherty combiner as shown in FIG. 4.

Embodiments of the invention comprises the following features and characteristics:

An embodiment of a transmitter uses a dual-fed antenna element in a Doherty PA architecture. In doing so both the matching networks between PA and antenna and the combiner in Doherty PAs are eliminated.

Doherty combiner and matching networks 40' are eliminated and replaced by a dual-fed antenna element AN. This leads to smaller size, fewer components, and potentially higher efficiency.

The power from the main- and auxiliary amplifiers are combined in the antenna radiating element that eliminates power losses which otherwise occur in PCB (Printed Circuit Board) combiners.

According to an aspect of the invention, the two power amplifier output signals are each multiplied by an optimal amplitude and a phase factor before adding them up. The antenna dimensions control these complex-valued factors, although not independently. The distance between the signal/feeds F1, F2 affects the phase relation between the two signals and the respective distances d1, d2, between the antenna element parts A1, A2 and the ground plate (see FIG. 8) affects largely the amplitude. The signals are summed through superimposing the fields under the antenna element parts A1, A2 the sum of which then leaves the antenna through an aperture via the antenna side(s), c. f. the view of FIG. 6.

When such an element is designed by using low-loss materials (e.g. metal only materials—separated by air), the antenna efficiency can be maximized, and heat dissipation problems can be minimized. This leads to higher output power per antenna element compared to previous solutions.

Two-antenna Doherty elements, as shown in FIG. 3, is eliminated and replaced by one Doherty active element with two feeds F1, F2 so that the feeds share the same radiating physical aperture area AN. This leads to reduced element-separation distance in regular arrays of such elements that is required for efficient beam-steering—this is not possible with previous solutions.

It is possible to generalize the black-box Doherty theory to include multiple auxiliary amplifiers. A large range of novel multi-fed antenna elements could be then designed and used for such transmitters, both in single-antenna and array architectures.

In the black-box combiner theory, the phase delay (θ) is used to satisfy the two- to three port conversion (see FIG. 1). This conversion is not needed when implementing the antenna element directly inside the lossy two-port 43. With a freedom in choosing θ, several two-port impedance matrices are possible and the ones most suitable from an antenna or PA (Power Amplifier) design perspective can be chosen.

The black-box combiner technique has also been demonstrated for out-phasing transmitters [14]. Embodiments of the invention can equally well be applied in out-phasing PA architectures.

The efficiency of the main- and auxiliary transistors will be the same as the solution in FIG. 1 when the antenna element implements the impedance matrix found from the black-box Doherty solution. The losses of the combiner 40' can be reduced if a low-loss antenna element design is selected. The size, cost and complexity of the active antenna transmitter can be reduced since all intermediate matching elements between the antenna and PA are eliminated.

Further Embodiments

Initial simulations have been performed to verify the feasibility of the concept. The 2.14 GHz, 25 W Gallium Nitride, GaN, Doherty PA design presented in [6] is used as an example. Load-pull transistor simulations were used to determine the following optimal parameters of the lossy two-port combiner:

$$Z_{combiner} = \begin{bmatrix} 2.8 + j39.3 & -10 - 28.6 \\ -10 - j28.6 & 36.1 + j31.6 \end{bmatrix}$$

A dual-fed planar inverted F antenna element may be chosen. The feed points and antenna dimensions were then optimized with the objective of minimizing the difference between the realized and optimal impedance matrix shown above.

Figure 6:
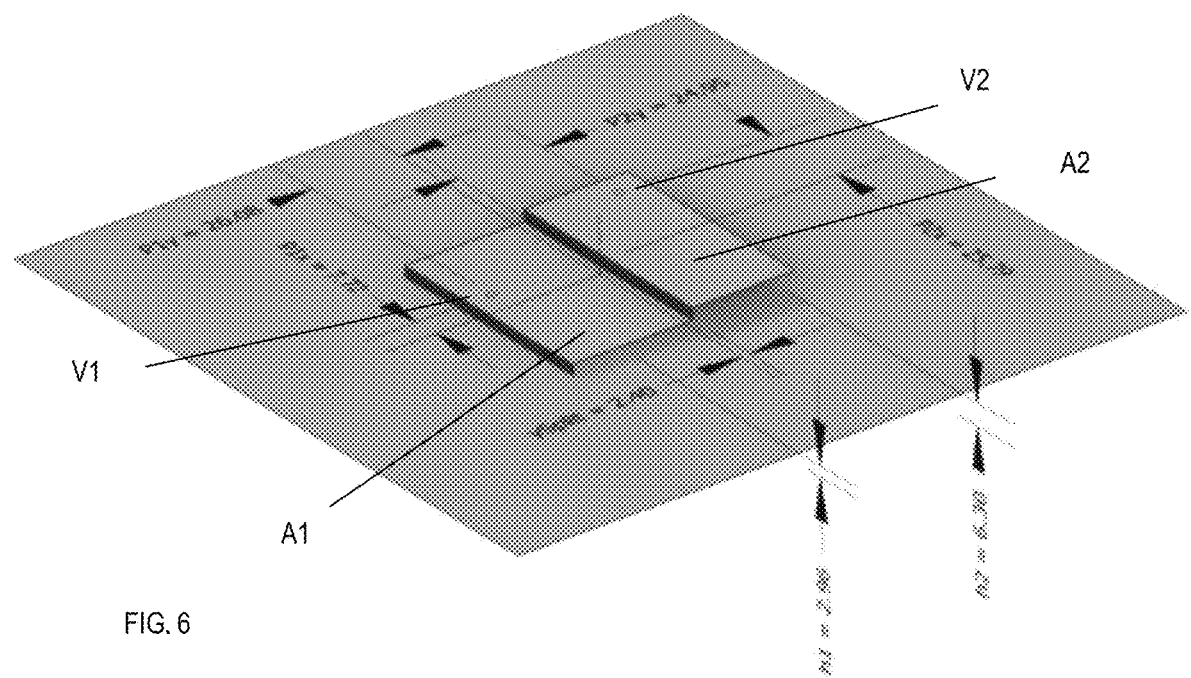
FIG. 6-8 show an embodiment of a dual-fed planar inverted F antenna element, optimized to provide the desired Doherty combiner lossy two-port parameters according to an embodiment of the invention.
Figure 7:
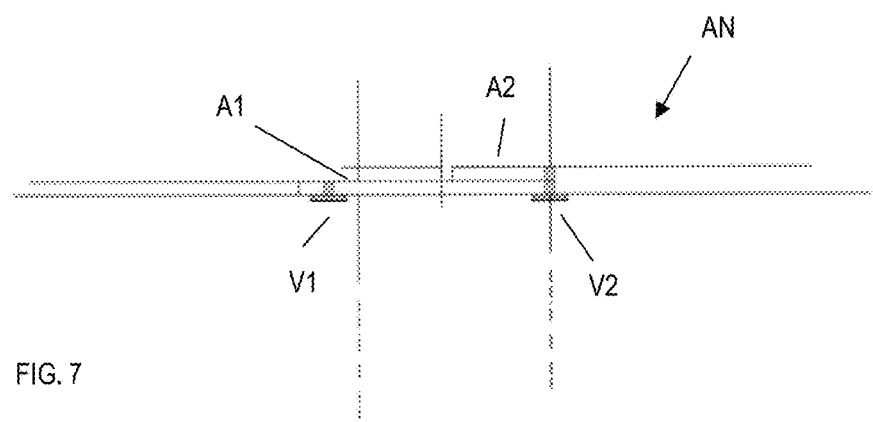
Figure 8:
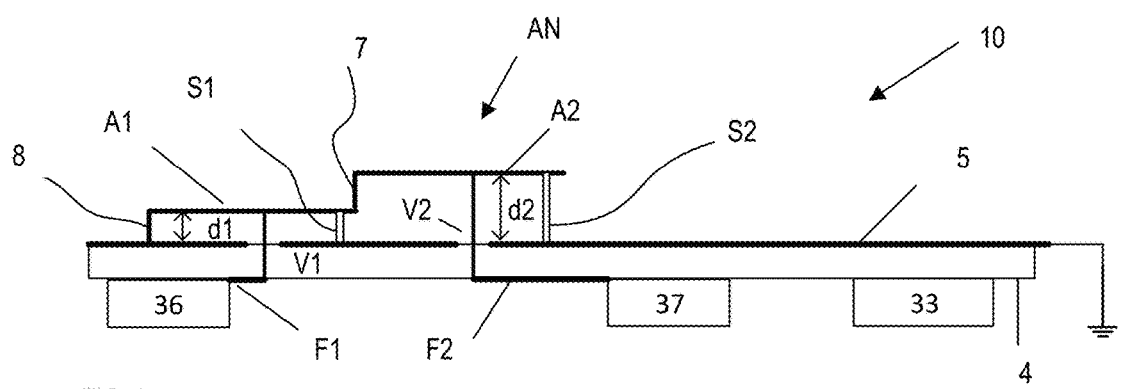

FIGS. 6-8 show the realization of such an antenna.

The antenna element is a dual-fed antenna element AN having first and second antenna parts A1, A2, the first antenna part A1 having a first feed F1, the second antenna part A2 having a second feed F2.

The antenna element is comprised in the transmitter 10 comprising a Doherty amplifier and an antenna element AN, the Doherty amplifier comprising an input splitter 33, for splitting an input signal to a main amplifier 36 having an output and to a phase delay 35 connecting again to an auxiliary amplifier 37 having an output.

The output of the main amplifier 36 connecting to the first feed F1 of the dual feed antenna element, and the output of the auxiliary amplifier 37 connecting to the second feed F2 of the dual feed antenna element.

The dual fed antenna element AN, 43' implements lossy two-port parameters of a black-box combiner derivation such that the antenna element AN, 43' simultaneously is acting as a radiator, impedance matching network, and Doherty combiner.

The antenna element may be a planar Inverted-F Antenna element AN having a ground plane, whose antenna parts A1, A2 are galvanically connected with one another and with the ground plane 5, each antenna part having a predetermined distance d1, d2 to the ground plane 5, the predetermined distances being different from one another. The distances, d1 and d2, contributes to provide the desired impedance matrix Z.

The transmitter may further comprise a printed circuit board, PCB, 4, having a set of vias V1, V2 connecting to the respective feeds F1, F2.

The antenna parts A1, A2 are supported by supports S1, S2 extending between the ground plane 4 and the antenna parts A1, A2 for providing a space between the antenna parts A1, A2 and the ground plane 5. The supports may be made of metal and galvanically connect the ground plane and a respective antenna part A1, A2 for further improving wideband properties of the antenna.

Intermediate sections 7, 8 connects the ground plane 5 and the antenna parts A1, A2, the intermediate sections being arranged at an angle, such as 90 degrees, with respect to the ground plane.

The phase delay component 35, and the main and auxiliary amplifier 36, 37 may be mounted on one side of the PCB, the antenna parts A1, A2 being mounted on the other side.

The following impedance matrix for the optimized antenna element is thereby achieved:

$$Z_{antenna} = \begin{bmatrix} 5.8 + j38.8 & -8.8 - j27.8 \\ -8.8 - j27.8 & 34.9 + j29.6 \end{bmatrix}$$

Comparing $Z_{antenna}$ with $Z_{combiner}$, they show a relatively good agreement between the antenna design, even for this initial investigation. This proves the feasibility of designing an antenna element that satisfies the conditions of a practical Doherty implementation of embodiments of the invention.

Further Advantages

A small size can be accomplished for embodiments of the invention. The size can be significantly reduced since the matching- and combiner networks between antenna elements and main-/auxiliary PAs in a Doherty configuration are eliminated.

Lower cost

With reduced size and fewer components, the cost can be minimized.

Higher efficiency. Elimination of combiner and intermediate impedance matching networks will reduce the losses and hence increase the efficiency. A large variety of multi-fed antenna element realizations will be available, and the one with lowest losses can be selected.

Higher power per antenna element

The power from two transistors (the main- and auxiliary) are combined in the dual-fed antenna element. The number of antenna elements in antenna array solutions can therefore be reduced, which leads to wider beams and less sensitive systems.

Heat dissipation. Since transistors can be mounted directly on a metal part of the antenna element, the antenna element can serve as a heat-sink as well.

Suitability for wide-angle beam-steering active Doherty antenna arrays. The antenna element design with a common radiating physical aperture for two feeds enables to accommodate such Doherty elements in arrays with the inter-element separation distance that is necessary for avoiding radiating grating lobes. This makes the proposed design suitable for wide-angle beam-steering array applications.

In the following, an exemplary method for designing embodiments of the invention is described:

By using the black-box combiner approach in [3-7], Doherty PAs with many degrees of freedom can be designed. Here follows one example of the steps in a design procedure:

a1. Select suitable transistors for the main 36 and auxiliary transistors. Determine the class-B bias of the main transistor and the class-C bias of the auxiliary transistor. Find the peak power of the Doherty PA and determine the output power back-off level where the second efficiency peak should occur [3-7].

a2. Find the optimal load impedances for the main 36 and auxiliary 37 transistors at peak power and find the optimal load impedance for the main transistor at the pre-determined output power back-off. At the backed-off power level, the auxiliary transistor is turned off. The optimal impedances are found through load pull simulations or measurements. The optimal impedances are selected as a trade-off between efficiency and linearity [7].

a3. Calculate the two-port network parameters of a two-port output combiner (not shown) with an embedded load resistance from the optimal impedances found in step A2, according to the black-box combiner method described in [3-7]. The two-port output combiner is a mathematical concept and represents an intermediate step of said known method In the prior art, a circuit realization (40') of the two-port output combiner requires the resistive part of the two-port combiner to be broken out of the two-port network, i.e. the lossy two-port 43 must be converted to an equivalent lossless three-port network 40 with one port terminated with a lossy element. This lossy element is the antenna element R_L, 41. This conversion also determines the phase shift between the main and auxiliary transistor. In the prior art, a circuit realization 40' of the three-port output combiner 40 can then be made with lumped elements and/or transmission lines [8].

a4. In contrast to the prior art, the functionality of the two-port output power combiner (43) is—according to embodiments of the invention—directly achieved by a dual feed antenna element, AN with antenna properties 43', i.e. a conversion to three-port parameters (step A4') is not carried out in embodiments of the present invention. Hence, the calculated two-port output combiner described under a3. forms directly a basis for the antenna element to be used.

a5. Select an antenna type which can be fed with two strongly coupled ports while having the same/shared radiating aperture area. A strong coupling between the ports is required to realize the off-diagonal elements of the impedance matrix. Depending on the required $Z\_12$ the ports may be spatially separated at distance in the order of a quarter wavelength at the operational frequency.

a6. Determine which geometrical (or electrical, like permittivity) parameters of the antenna element have the most critical effects on the antenna 2×2 impedance matrix without significantly disturbing the antenna radiation pattern shape and polarization.

a7. Optimize the parameters such that the antenna impedance matrix as closely as possible matches the two-port network parameters of the output combiner, as calculated from the optimal impedances in Step A3, while satisfying constraints on the allowable variation of the radiation pattern shape/polarization with input power to the transistors.

a8. If a desirable impedance matrix cannot be obtained, modify the radiating antenna element geometry and/or antenna feeds and go to Step a6; or select another type of the dual-fed antenna element (Step a5).

As a purely exemplary embodiment, for the 2.14 GHz, 25 W GaN Doherty PA design presented in [6], each step in the design are:

b1. The main and auxiliary transistors are identical. The gate of the main transistor is biased at the threshold voltage for class-B operation and the class-C biased auxiliary transistor is biased at −8 V. The peak power of the Doherty PA is 44.9 dBm and the pre-determined back-off power is 36.2 dBm, i.e. 8.7 dB back-off.

b2. From load-pull simulations using a nonlinear transistor model, the optimal load impedance of the main transistor at peak power is $$20.4+j12.9 \text{ Ohm}$$

the optimal load impedance of the main transistor at the backed-off power level is $$19.9+j41.5 \text{ Ohm}$$

the optimal load impedance of the auxiliary transistor at peak power is $$15.1+j23.1 \text{ Ohm}$$

b3. The parameters of the lossy two-port combiner 43 parameters are calculated using expressions in [6]:

$$Z_{combiner} = \begin{bmatrix} 2.8 + j39.3 & -10 - 28.6 \\ -10 - j28.6 & 36.1 + j31.6 \end{bmatrix}$$

b4. The phase shift between the main and auxiliary transistor is calculated to −50 degrees (the argument of the ratio of auxiliary transistor current over main transistor current) for a conventional circuit realization of the circuit. In contrast to the state-of-the-art, the functionality of the output power combiner can be achieved by a dual feed antenna element.

The antenna design steps for the Doherty PA described above may be carried out as follows:

c5. A Planar Inverted-F Antenna (PIFA) as shown in FIGS. 6-8 may be selected because it has a good capability to realize a wide range of the input impedances/couplings.

c6. The antenna parameters to be optimized are: position of the first and second feeds, F1, F2; position of the supports S1, S2; respective distances d1, d2 from ground plane to parts A1 and A2 above 1st and 2nd feeds; location of the top plate bend 7 between parts A1 and A2.

c7. The optimization may be performed using "Trust Region Framework" and "CMA Evolution Strategy" optimizers in CST Microwave Studio, without constrains on the radiation pattern. shape/polarization. The resulting impedance matrix at operating frequency is $$Z_{antenna} = \begin{bmatrix} 5.8 + j38.8 & -8.8 - j27.8 \\ -8.8 - j27.8 & 34.9 + j29.6 \end{bmatrix}$$

which is close to the optimal one determined in Step B3.

c8. The matching "short-circuiting" pins may be used which allows to obtain a better impedance 2×2 matrix (closer to the optimal one) and to reduce its variation with frequency (to achieve a wider frequency band).

Figure 9:
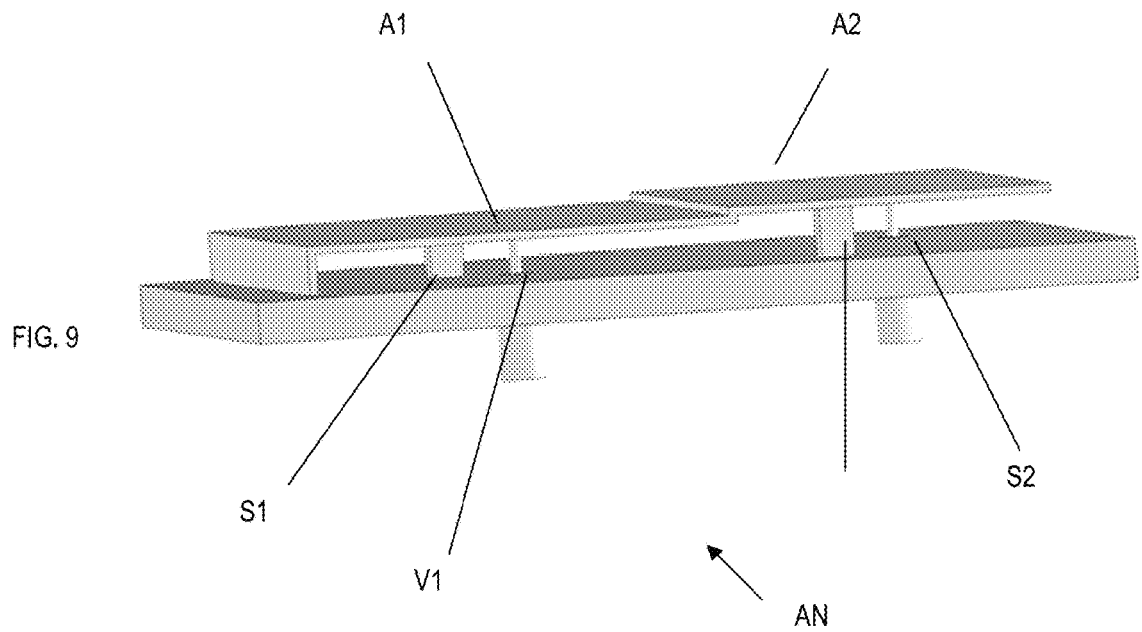
FIGS. 9-10 show further embodiments of a dual fed antenna element having coax feeds.
Figure 10:
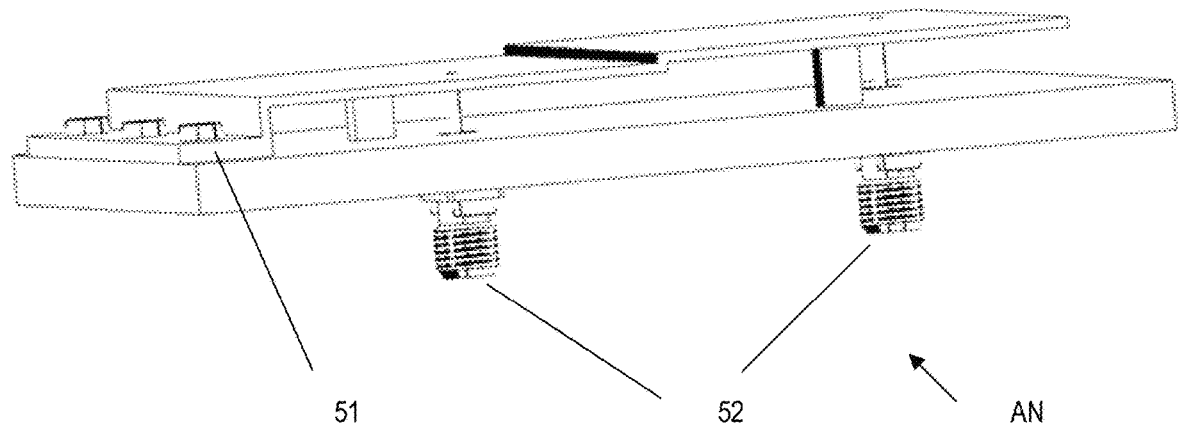

In FIGS. 9 and 10 an alternative embodiment is shown where the dual fed antenna element is shown having coax feeds. Supports S1 and S2 are formed as vertical plates or pins. The width of the plates could amount to around 10% of an antenna part, A1, A2. The intermediate sections and the antenna parts 7, 8 are made of a metal sheet and fixed to a PCB by means of screws 51 in this embodiment.

In conclusion, there is provided a transmitter 10 comprising a Doherty amplifier and an antenna element AN, the Doherty amplifier comprising an input splitter 33, for splitting an input signal to a main amplifier 36 having an output and to a phase delay 35 connecting again to an auxiliary amplifier 37 having an output.

The antenna element is a dual-fed antenna element AN having first and second antenna parts A1, A2, the first antenna part A1 having a first feed F1, the second antenna part A2 having a second feed F2. The output of the main amplifier 36 connecting to the first feed F1 of the dual feed antenna element, and the output of the auxiliary amplifier 37 connecting to the second feed F2 of the dual feed antenna element. The dual-fed antenna element AN, 43' implements lossy two-port parameters of a combiner derivation such that the antenna element AN, 43' simultaneously is acting as a radiator, impedance matching network, and Doherty combiner.

The antenna element can be a planar Inverted-F Antenna element AN having a ground plane, whose antenna parts A1, A2 are galvanically connected with one another and with the ground plane 5, each antenna part having a predetermined distance d1, d2 to the ground plane 5, the predetermined distances being different from one another.

The transmitter may further comprise a printed circuit board, PCB, 4, having a set of vias V1, V2 connecting to the respective feeds F1, F2.

The antenna parts A1, A2 may be supported by supports S1, S2, such as pins or walls, extending between the ground plane 4 and the antenna parts A1, A2 for providing a space between the antenna parts A1, A2 and the ground plane 5, the supports galvanically connecting the ground plane and a respective antenna part A1, A2.

Intermediate sections 7, 8 may connect the ground plane 5 and the antenna parts A1, A2, while the intermediate sections being arranged at an angle, such as 90 degrees, with respect to the ground plane.

The input splitter 33, the phase delay component 35, and the main and auxiliary amplifier 36, 37 may be mounted on one side of the PCB, while the antenna parts A1, A2 may be mounted on the other side.

The lossy two-port parameters of the combiner derivation—also denoted black-box combiner derivation—may be based on determining (a1) a class-B bias of the main transistor and a class-C bias of the auxiliary transistor (a1), finding (a2) the peak power of the Doherty PA and determining the output power back-off level where a second efficiency peak should occur, finding (a2) optimized load impedances for the main 36 and auxiliary 37 transistors at peak power and finding the optimal load impedance for the main transistor 36 at the pre-determined output power back-off, calculating (a3) the two-port network parameters of a two-port output combiner from the optimized load impedances, determining (a5) geometrical parameters of the antenna element that have critical effects on an antenna 2×2 impedance matrix without significantly disturbing the antenna radiation pattern shape and polarization, optimizing (a7) the parameters such that the antenna impedance matrix is approaching or matching the two-port network parameters of the two-port output combiner.

As stated above a method of constructing or designing a transmitter 10 comprising a Doherty amplifier and an antenna element AN, is provided.

The method comprises the steps of providing the Doherty amplifier comprising an input splitter 33, for splitting an input signal to a main amplifier 36 having an output and to a phase delay 35 connecting again to an auxiliary amplifier 37 having an output, providing an antenna element that is a dual-fed antenna element AN having first and second antenna parts A1, A2, the first antenna part A1 having a first feed F1, the second antenna part A2 having a second feed F2, arranging the output of the main amplifier 36 connecting to the first feed F1 of the dual feed antenna element, arranging the output of the auxiliary amplifier 37 connecting to the second feed F2 of the dual feed antenna element, forming the dual-fed antenna element AN, 43' such that it implements lossy two-port parameters of a black-box combiner derivation such that the antenna element AN, 43' simultaneously is acting as a radiator, impedance matching network, and Doherty combiner.

The lossy two-port parameters of the black-box combiner derivation may be based on determining (a1) a class-B bias of the main transistor and a class-C bias of the auxiliary transistor (a1), finding (a2) the peak power of the Doherty PA and determining the output power back-off level where a second efficiency peak should occur, finding (a2) optimized load impedances for the main 36 and auxiliary 37 transistors at peak power and finding the optimal load impedance for the main transistor 36 at the pre-determined output power back-off, calculating (a3) the two-port network parameters of a two-port output combiner from the optimized load impedances, determining (a5) geometrical parameters of the antenna element that have critical effects on an antenna 2×2 impedance matrix without significantly disturbing the antenna radiation pattern shape and polarization, optimizing (a7) the parameters such that the antenna impedance matrix is approaching or matching the two-port network parameters of the two-port output combiner.

REFERENCES

[1] F. H. F. H. Raab et al., "Power amplifiers and transmitters for RF and microwave," IEEE Trans. Microw. Theory Tech., vol. 50, no. 3, pp. 814-826, March 2002.
[2] V. Camarchia, M. Pirola, R. Quaglia, S. Jee, Y. Cho, and B. Kim, "The Doherty Power Amplifier: Review of Recent Solutions and Trends," IEEE Trans. Microw. Theory Tech., vol. 63, no. 2, pp. 559-571, February 2015.
[3] M. Özen and C. Fager, "Amplifier Apparatus and Method," WO2015055242, 2013.
[4] W. Hallberg, M. Özen, and C. Fager, "Class-B/C Doherty Power Amplifier," U.S. Pat. No. 9,614,479 B2, 2017.
[5] M. Ozen, N. Rostomyan, K. Aufinger, and C. Fager, "Efficient Millimeter Wave Doherty PA Design Based on a Low-Loss Combiner Synthesis Technique," IEEE Microw. Wirel. Components Lett., vol. 27, no. 12, pp. 1143-1145, December 2017.
[6] M. Ozen, K. Andersson, and C. Fager, "Symmetrical Doherty Power Amplifier With Extended Efficiency Range," IEEE Trans. Microw. Theory Tech., vol. 64, no. 4, pp. 1273-1284, April 2016.
[7] W. Hallberg, M. Ozen, D. Gustafsson, K. Buisman, and C. Fager, "A Doherty Power Amplifier Design Method for Improved Efficiency and Linearity," IEEE Trans. Microw. Theory Tech., vol. 64, no. 12, pp. 4491-4504, December 2016.
[8] W. R. Deal, V. Radisic, Yongxi Qian, and T. Itoh, "Integrated-antenna push-pull power amplifiers," IEEE Trans. Microw. Theory Tech., vol. 47, no. 8, pp. 1418-1425, 1999.
[9] V. Radisic, Y. Qian, and T. Itoh, "Novel architectures for high-efficiency amplifiers for wireless applications," IEEE Trans. Microw. Theory Tech., vol. 46, no. 11 PART 2, pp. 1901-1909, 1998.
[10] W.-C. Liao et al., "A Ka-Band Active Integrated Antenna for 5G Applications: Initial Design Flow," in 2nd URSI AT-RASC, 2018.
[11] H. Wang et al., "Towards Energy-Efficient 5G Mm-Wave links: Exploiting broadband Mm-Wave doherty power amplifier and multi-feed antenna with direct on-antenna power combining," in 2017 IEEE Bipolar/BiCMOS Circuits and Technology Meeting (BCTM), 2017, pp. 30-37.
[12] S. Jia, W. Chen, and D. Schreurs, "A Novel Doherty Transmitter Based on Antenna Active Load Modulation," IEEE Microw. Wirel. Components Lett., vol. 25, no. 4, pp. 271-273, 2015.
[13] M. Pampin-Gonzalez, M. Ozen, C. Sanchez-Perez, J. Chani-Cahuana, and C. Fager, "Outphasing combiner synthesis from transistor load pull data," in 2015 IEEE MTT-S International Microwave Symposium, 2015, pp. 1-4

The invention claimed is:

1. A transmitter comprising a Doherty amplifier and an antenna element (AN),
the Doherty amplifier comprising an input splitter, for splitting an input signal to a main amplifier having an output and to a phase delay connecting again to an auxiliary amplifier having an output,
wherein the antenna element is a dual-fed antenna element (AN) having first and second antenna parts (A1, A2),
the first antenna part (A1) having a first feed (F1),
the second antenna part (A2) having a second feed (F2),
the output of the main amplifier connecting to the first feed (F1) of the dual feed antenna element,
the output of the auxiliary amplifier connecting to the second feed (F2) of the dual feed antenna element,
wherein the dual-fed antenna element (AN, 43') implements lossy two-port parameters of a combiner derivation such that the antenna element (AN, 43') simultaneously is acting as a radiator, impedance matching network, and Doherty combiner.

2. The transmitter according to claim 1, wherein the antenna element is a planar Inverted-F Antenna element (AN) having a ground plane, whose antenna parts (A1, A2) are galvanically connected with one another and with the ground plane, each antenna part having a predetermined distance (d1, d2) to the ground plane, the predetermined distances being different from one another.

3. The transmitter according to claim 1, further comprising a printed circuit board, PCB, having a set of vias (V1, V2) connecting to the respective feeds (F1, F2).

4. The transmitter according to claim 3, wherein the antenna parts (A1, A2) are supported by supports (S1, S2) extending between the ground plane and the antenna parts (A1, A2) for providing a space between the antenna parts (A1, A2) and the ground plane, the supports galvanically connecting the ground plane and a respective antenna part (A1, A2).

5. The transmitter according to claim 4, wherein intermediate sections connects the ground plane and the antenna parts (A1, A2), the intermediate sections being arranged at an angle, such as 90 degrees, with respect to the ground plane.

6. The transmitter according to claim 3, the input splitter, the phase delay component, and the main and auxiliary amplifier being mounted on one side of the PCB, the antenna parts (A1, A2) being mounted on the other side.

7. The transmitter according to claim 1 wherein the combiner derivation is a black-box combiner derivation and the lossy two-port parameters of the black-box combiner derivation is based on determining (a1) a class-B bias of the main transistor and a class-C bias of the auxiliary transistor (a1), finding (a2) the peak power of the Doherty PA and determining the output power back-off level where a second efficiency peak should occur, finding (a2) optimized load impedances for the main and auxiliary transistors at peak power and finding the optimal load impedance for the main transistor at the pre-determined output power back-off, calculating (a3) the two-port network parameters of a two-port output combiner from the optimized load impedances, determining (a5) geometrical parameters of the antenna element that have critical effects on an antenna 2×2 impedance matrix without significantly disturbing the antenna radiation pattern shape and polarization, optimizing (a7) the parameters such that the antenna impedance matrix is approaching or matching the two-port network parameters of the two-port output combiner.

8. A method of constructing a transmitter including a Doherty amplifier and an antenna element (AN), the method comprising:

providing the Doherty amplifier comprising an input splitter, for splitting an input signal to a main amplifier having an output and to a phase delay connecting again to an auxiliary amplifier having an output, providing an antenna element that is a dual-fed antenna element (AN) having first and second antenna parts (A1, A2), the first antenna part (A1) having a first feed (F1), the second antenna part (A2) having a second feed (F2), arranging the output of the main amplifier connecting to the first feed (F1) of the dual feed antenna element, arranging the output of the auxiliary amplifier connecting to the second feed (F2) of the dual feed antenna element, forming the dual-fed antenna element (AN, 43') such that it implements lossy two-port parameters of a combiner derivation such that the antenna element (AN, 43') simultaneously is acting as a radiator, impedance matching network, and Doherty combiner.

9. The method according to claim 8, wherein the combiner derivation is a black-box combiner derivation and the lossy two-port parameters of the black-box combiner derivation is based on determining (a1) a class-B bias of the main transistor and a class-C bias of the auxiliary transistor (a1), finding (a2) the peak power of the Doherty PA and determining the output power back-off level where a second efficiency peak should occur, finding (a2) optimized load impedances for the main and auxiliary transistors at peak power and finding the optimal load impedance for the main transistor at the pre-determined output power back-off, calculating (a3) the two-port network parameters of a two-port output combiner from the optimized load impedances, determining (a5) geometrical parameters of the antenna element that have critical effects on an antenna 2×2 impedance matrix without significantly disturbing the antenna radiation pattern shape and polarization, optimizing (a7) the parameters such that the antenna impedance matrix is approaching or matching the two-port network parameters of the two-port output combiner.

\* \* \* \* \*